United States Patent
Zhou et al.

(10) Patent No.: US 8,609,302 B2
(45) Date of Patent: Dec. 17, 2013

(54) LITHOGRAPHY METHODS, METHODS FOR FORMING PATTERNING TOOLS AND PATTERNING TOOLS

(75) Inventors: Jianming Zhou, Boise, ID (US); Scott L. Light, Boise, ID (US); David Kewley, Boise, ID (US); Prasanna Srinivasan, Boise, ID (US); Anton deVilliers, Boise, ID (US)

(73) Assignee: Micron Technology, Inc., Boise, ID (US)

(*) Notice: Subject to any disclaimer, the term of this patent is extended or adjusted under 35 U.S.C. 154(b) by 115 days.

(21) Appl. No.: 13/214,865

(22) Filed: Aug. 22, 2011

(65) Prior Publication Data

US 2013/0052566 A1   Feb. 28, 2013

(51) Int. Cl.
*G03F 1/60* (2012.01)

(52) U.S. Cl.
USPC .............................................................. 430/5

(58) Field of Classification Search
USPC ...................... 430/5, 322, 323, 324
See application file for complete search history.

(56) References Cited

U.S. PATENT DOCUMENTS

| | | | |
|---|---|---|---|
| 5,888,675 A | 3/1999 | Moore et al. | |
| 6,207,333 B1 * | 3/2001 | Adair et al. | 430/5 |
| 6,791,666 B2 | 9/2004 | Yu et al. | |
| 7,855,776 B2 | 12/2010 | Kuechler et al. | |
| 2005/0007573 A1 | 1/2005 | Hansen et al. | |
| 2008/0239272 A1 | 10/2008 | Wang et al. | |
| 2009/0296055 A1 | 12/2009 | Ye et al. | |

* cited by examiner

*Primary Examiner* — Stephen Rosasco
(74) *Attorney, Agent, or Firm* — Schwegman, Lundberg & Woessner, P.A.

(57) ABSTRACT

Methods of lithography, methods for forming patterning tools, and patterning tools are described. One such patterning tool include an active region that forms a first diffraction image on a lens when in use, and an inactive region that forms a second diffraction image on a lens when in use. The inactive region includes a pattern of phase shifting features formed in a substantially transparent material of the patterning tool. Patterning tools and methods, as described, can be used to compensate for lens distortion from effects such as localized heating.

17 Claims, 5 Drawing Sheets

LITHOGRAPHY METHODS, METHODS FOR FORMING PATTERNING TOOLS AND PATTERNING TOOLS

TECHNICAL FIELD

Various embodiments described herein relate to apparatus, systems, and methods associated with lithography, for example reticles and methods for using reticles in the manufacture of semiconductor components.

BACKGROUND

Photolithography is a fabrication technique that is employed for use in a number of industries, including the semiconductor processing industry. Specifically, photolithography exposes energy, such as ultraviolet (UV) light, x-ray wavelength, other wavelengths of radiation, etc. to selected regions of a surface. In one common technique, the surface includes a semiconductor wafer such as silicon that has been coated with a resist material. The resist material properties are locally changed when exposed to the energy source, which allows selected regions of the resist material to remain, while unwanted regions of the resist material are removed.

In one method of photolithography, a pattern of features is formed on a patterning tool, such as a reticle or mask, (a patterning tool is referred to hereinafter in the specification by example as a "reticle") and energy transmitted through the pattern on the reticle is focused onto a working surface to print functionally important features on the working surface using a lens that adjusts the scale of the pattern on the reticle to fit the working surface. In the semiconductor industry, there is an ever present pressure to reduce the size of features in the pattern to increase the density of printed features packed into the same semiconductor surface area. In one example industry, manufacturers of memory chips such as dynamic random access memory (DRAM) or flash memory strive to put more storage cells onto a single chip.

As feature size decreases, photolithography of smaller and smaller features becomes more and more difficult. Imaging fidelity can be degraded by some non-ideal properties of a lens, such as aberrations. During high volume manufacturing, a lens constantly receives energy and lens heating may cause optical aberrations. Methods and devices to reduce lens heating induced optical aberrations are needed to keep pace with ever increasing photolithography demands such as smaller feature sizes.

DETAILED DESCRIPTION

In the following detailed description of the invention, reference is made to the accompanying drawings that form a part hereof and in which are shown, by way of illustration, specific embodiments in which the invention may be practiced. These embodiments are described in sufficient detail to enable those skilled in the art to practice the invention. Other embodiments may be utilized and logical, electrical changes, etc. may be made.

The term "horizontal" as used in this application is defined as a plane parallel to the conventional plane or surface of a substrate, such as a wafer, die, or reticle, regardless of the orientation of the substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the substrate, regardless of the orientation of the substrate. The following detailed description is, therefore, not to be taken in a limiting sense, and the scope of the present invention is defined only by the appended claims, along with the full scope of equivalents to which such claims are entitled.

Figure 1:
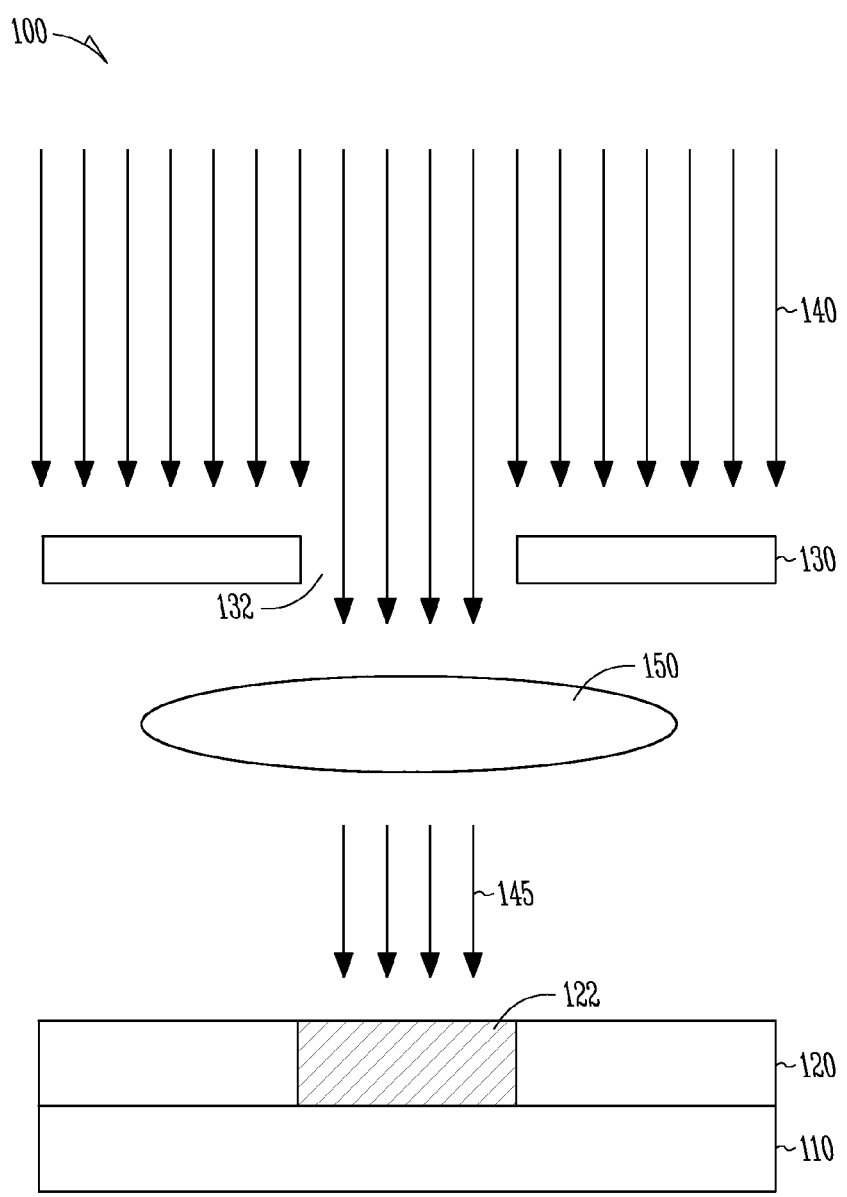
FIG. 1 shows a photolithography system according to the prior art.

FIG. 1 shows a system where a pattern of features is formed on a reticle and the pattern is then transferred to a working surface by photolithography. In one embodiment the pattern of features transferred to the working surface includes semiconductor device component features, including, but not limited to, source/drain regions, transistor gates, trace lines, source/drain contacts, vias, capacitor plates, etc. FIG. 1 shows a photolithography system 100 according to an embodiment of the invention. The system 100 can operate on a substrate 110. In one embodiment, the substrate 110 includes a semiconductor substrate, such as a silicon wafer. Although a semiconductor substrate is discussed for illustration, embodiments of the invention will comprise other working surfaces utilizing photolithography.

A resist material 120 is located over a surface of the substrate 110. A reticle 130 is shown with a substantially transparent region (shown as an opening 132), and is spaced apart from the resist material 120 by an optical system. The reticle 130 is shown in a simplified form with an energy blocking region and an opening 132 in the energy blocking region. Although depicted in FIG. 1 as an opening 132, in one embodiment, the substantially transparent region can comprise a material such as glass or quartz. In one embodiment, the energy blocking region of the reticle 130 includes an energy blocking (e.g., opaque) material, such as chrome, adapted to block a portion of energy 140 being transmitted from an energy source and/or an attenuating (e.g., partly opaque) material, such as molybdenum silicide, adapted to phase shift a portion of the energy 140. The terms "transparent", "attenuated", "partly opaque" and other associated optical terms in the present specification refer to optical properties of the reticle 130. In one embodiment, examples of substantially transparent materials transmit greater than 99 percent of incident energy. In one embodiment, examples of substantially opaque materials block greater than 99 percent of incident energy. In one embodiment, examples of attenuating materials transmit between 1 and 99 percent of incident energy. Possible energies used in the process include, but are not limited to, UV radiation and x-ray radiation. One source of suitable energy is from a laser light source.

An energy source (not shown) transmits energy 140 toward the resist material 120, with a portion of the energy 140 being blocked by the reticle 130. A portion of the energy 140 is shown as being transmitted through the opening 132 in the reticle 130 and toward a lens 150 of projection optics (although only one lens is shown in FIG. 1, projection optics may comprise, for example, up to and in some cases more than 40 lenses). A lens 150, may be used to focus and/or scale the energy 140 transmitted through the reticle 130, thus allowing focused and/or scaled energy 145 to print smaller features onto the resist material 120 than might be possible using just a reticle 130. The focused and/or scaled energy 145 is shown contacting the resist material 120 in a selected region 122. The focused and/or scaled energy 145 interacts with the resist material 120 in the selected region 122 to selectively alter the properties of the resist material 120 in the selected region 122. Two possible alterations include a curing of the resist material and a weakening of the resist material. In one possibility, the resist material 120 in the selected region 122 is cured and remains while the non-selected region of the resist material 120 is removed. In another possibility, the resist material 120 in the selected region 122 is weakened and is removed while the non-selected region of the resist material remains.

Figure 2:
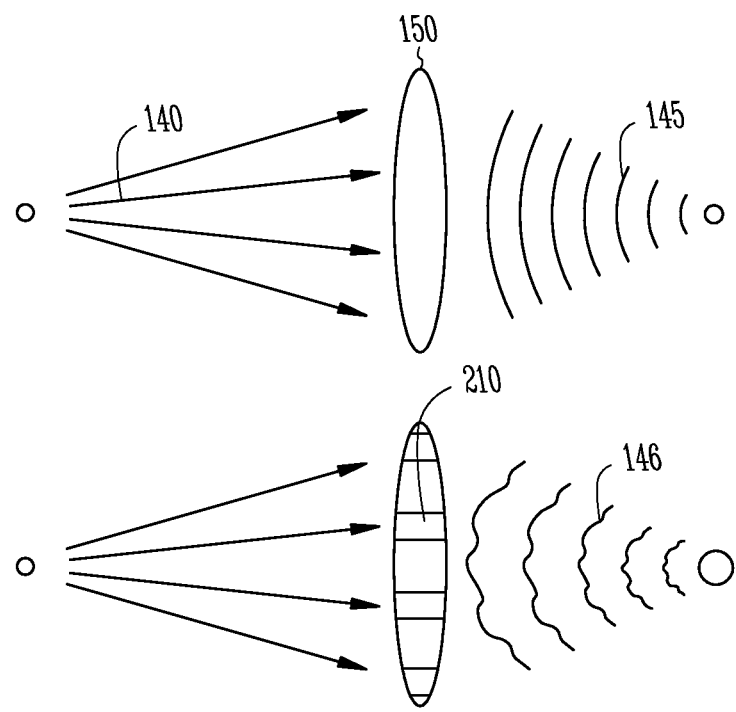
FIG. 2 shows a side view of a lens according to an embodiment of the invention.

FIG. 2 shows another side view of incident energy 140 interacting with a lens 150 to provide focused and/or scaled energy 145 similar to the diagram of FIG. 1. FIG. 2 further shows regions 210 of local heating of the lens 150 that can distort the shape of the lens 150, and produce a distorted energy pattern 146.

Figure 3:
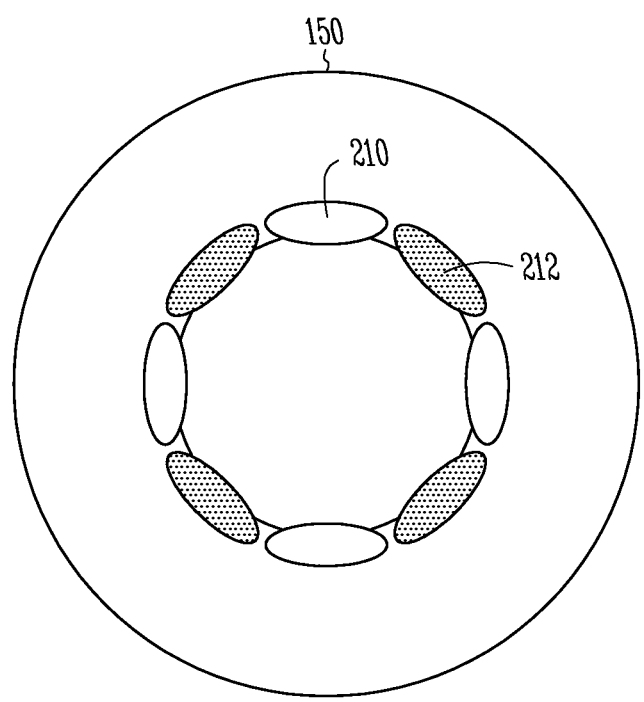
FIG. 3 shows a top view of the lens from FIG. 2 according to an embodiment of the invention.

FIG. 3 shows a top view of a lens 150, including the regions 210 of local heating. In one example, the regions 210 of local heating are produced by optical diffraction of a pattern in a reticle, such as reticle 130 from FIG. 1. FIG. 3 also shows regions 212 of the lens 150. When regions 212 are also heated along with regions 210, distortion in the lens 150 due to heating in regions 210 can be (at least partially) compensated, and optical aberrations reduced compared to only heating regions 210.

Figure 4A:
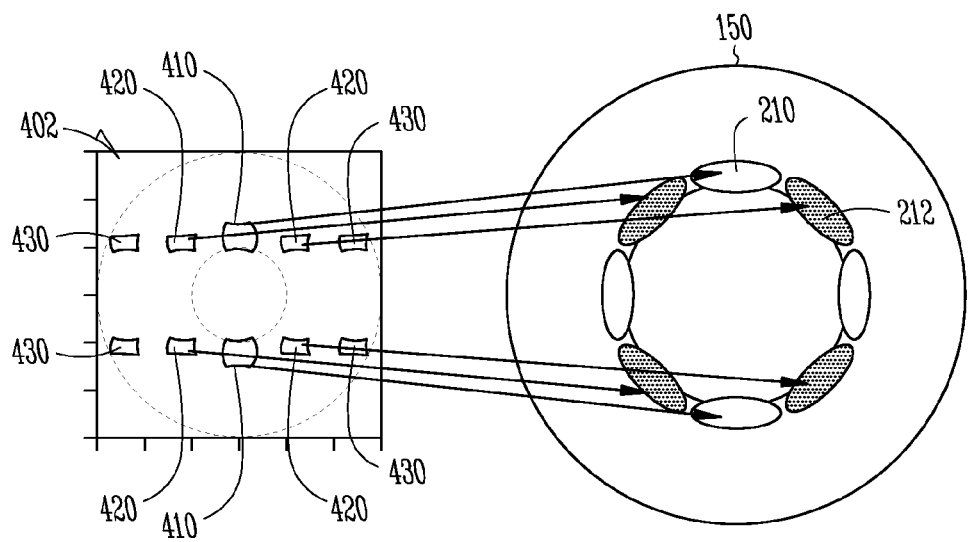
FIG. 4A shows a heat map and a top view of the lens from FIG. 2 according to an embodiment of the invention.

FIG. 4A shows a heat map 402 measured on a lens 150 when performing a lithography operation. The heat map 402 includes a pattern of zeroth order live pattern diffraction images 410. The zeroth order live pattern diffraction images 410 map to regions 210 of the lens 150, and by themselves, result in unwanted lens distortion. FIG. 4 further shows a pattern of first order sub-resolution fill (SRF) diffraction images 420, and second order SRF diffraction images 430. In the example shown, the first order SRF diffraction images 420 map to regions 212 of the lens 150. The addition of the first order SRF diffraction images 420 provide compensating heating from local heating in the lens 150 from the first order live pattern diffraction images 410. In other embodiments, other diffraction images, such as second order diffraction images 430 may provide compensating heating from local heating in the lens 150 from the first order live pattern diffraction images 410.

Figure 4B:
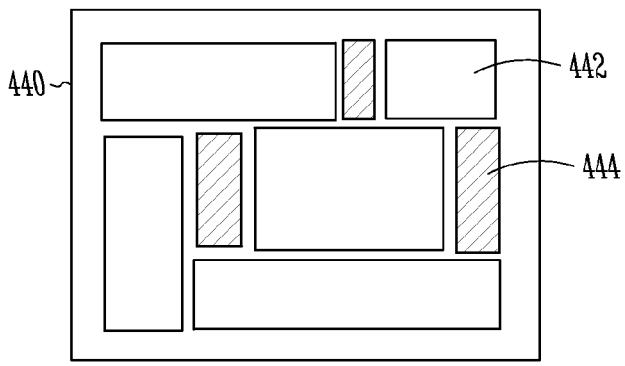
FIG. 4B shows a block diagram representation of a reticle, according to an embodiment of the invention.

FIG. 4B shows an example reticle 440 according to an embodiment of the invention. The reticle 440 includes first regions 442 and second regions 444. In one example, the first regions 442 are active regions that are used to form the pattern of live pattern diffraction images used to print functionally important features on the working surface (e.g., device features such as transistors and electrical transmission lines). In one example, the second regions 444 are inactive regions of the reticle 440, which are used to form a pattern of SRF diffraction images (which will not print a feature on the working surface) and/or a pattern of other images that will print functionally unimportant features on the working surface (e.g., images that will print so called "dummy" features on the working surface). In one example, the pattern of zeroth order live pattern diffraction images 410 from FIG. 4A are formed from interaction with the first regions 442. In one example, the pattern of first order SRF diffraction images 420 are formed from interaction with the second regions 444.

In one example, the second regions 444 are configured with diffraction gratings or similar features that are oriented to direct diffracted energy (e.g., light) of an order (e.g., first order, second order, third order, etc.) to regions 212 of lens 150 that at least partially compensate for heating in regions 210 of the lens that results from transmitting energy through the first regions 442. In one example, the features in the second regions are formed as sub-resolution features. Sub-resolution features will not print on a working surface, however they will allow a portion of incident energy to diffract, and heat regions 212.

As devices, such as semiconductor devices, become more efficient in their layout, less real estate is available for second regions 444. In one example, the second regions 444 are less than approximately 27 percent of the area of the reticle 440. In one example, the second regions 444 are less than approximately 11 percent of the area of the reticle 440.

Figure 5:
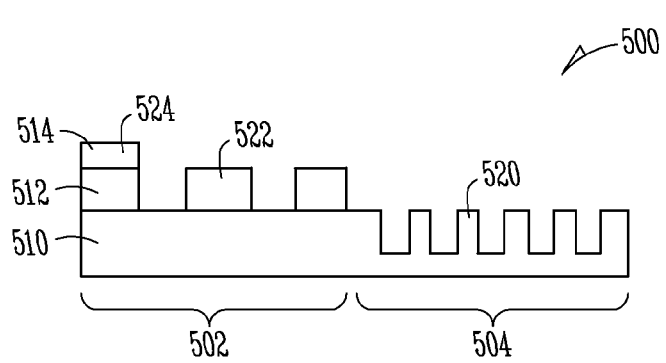
FIG. 5 shows a cross section representation of a reticle according to an embodiment of the invention.

FIG. 5 shows a cross section of a reticle 500 similar to reticle 440, from FIG. 4B. The reticle 500 includes a first region 502 that is an active region similar to regions 442, and a second region 504 that is an inactive region similar to regions 444. FIG. 5 illustrates a first reticle material 510, a second reticle material 512, and a third reticle material 514. In one example, the first reticle material 510 is substantially transparent. In one example, the first reticle material 510 includes a silicon dioxide glass or quartz substrate. In one example, the second reticle material 512 includes a layer of attenuating material. In one example, the second reticle material 512 includes molybdenum silicide. In one example, the third reticle material 514 includes a layer of energy blocking material, such as a substantially opaque layer. In one example, a substantially opaque material blocks greater than 99 percent of incident energy. In one example, the third reticle material 514 includes chrome.

Various portions of the reticle materials 510, 512, and 514 have been removed to form a pattern of features for lithography. For example, the second reticle material 512 is patterned to form features 522. In one example, the features 522 include phase shifting features. The third reticle material 514 is patterned to form features 524. In one example, the features 524 block substantially all (e.g. 99 percent or more) transmission of energy through the reticle 500. The first reticle material 510 is patterned to form features 520. In one example, the features 520 include phase shifting features.

Less efficient configurations may use an attenuating layer, such as the second reticle material 512, to form features in the second region 504 of the reticle 500. In the example shown in FIG. 5, all of the features in the second region 504, including features 520, are formed in a substantially transparent first reticle material 510. As a result, a higher amount of energy can be transmitted through the reticle 500 in the second region 504 as compared to an embodiment where the features 520 are formed in an attenuating material.

Using configurations shown in FIG. 5 and FIG. 4B, the second regions 444 can be made smaller as a percentage of the area of reticle 440, while transmitting the same amount of energy through the reticle to provide compensation to the lens. Alternatively, the second regions 444 can transmit more energy through the reticle to provide a greater compensating effect to the lens, while using the same percentage of the area of reticle 440. Using configurations shown in FIG. 5 and FIG. 4B, in one example, the second regions 444 are less than approximately 27 percent of the area of the reticle 440. In one example, the second regions 444 are less than approximately 11 percent of the area of the reticle 440.

FIGS. 6A-6F illustrate an example method of forming a reticle, according to an embodiment of the invention. In FIG.

Figure 6A:
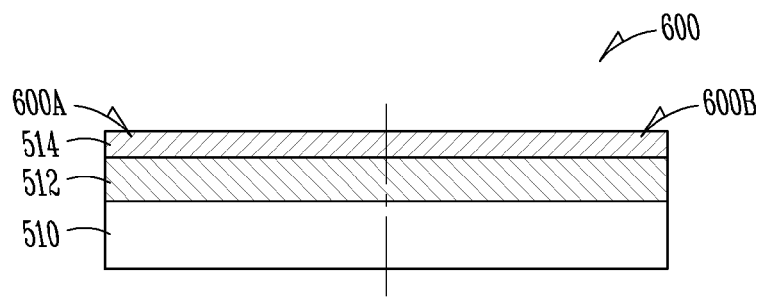
FIG. 6A-6G show processing steps in forming a reticle according to an embodiment of the invention.

6A, a second reticle material 512 is formed over a first reticle material, and a third reticle material 514 is formed over the second reticle material 512. As discussed above, in one example, the first reticle material 510 is substantially transparent. In one example, the first reticle material 510 comprises silicon dioxide glass or quartz, for example. In one example, the second reticle material 512 comprises an attenuating layer. In one example, the second reticle material 512 comprises molybdenum silicide. In one example, the third reticle material 514 comprises a substantially opaque layer. In one example, the third reticle material 514 comprises chromium (e.g., a layer of chrome). FIG. 6A shows a first region 600A and a second region 600B. In one example, the first region 600A comprises an active region, and the second region 600B comprises an inactive region.

Figure 6B:
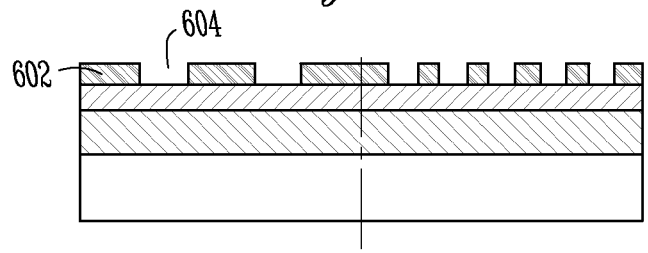
Figure 6C:
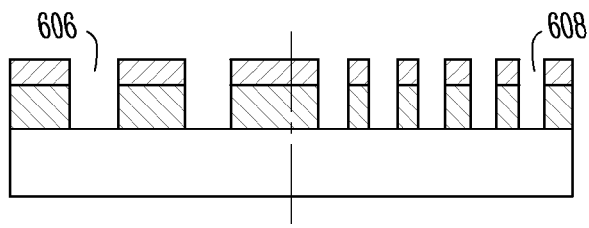

FIG. 6B shows an operation where a first resist 602 is formed on the third reticle material 514, and a pattern of features 604 is formed in the first resist 602. FIG. 6C shows an operation where the pattern of features 604 is used to remove material from the second reticle material 512 and the third reticle material 514 to form spaces 606 and 608. After the formation of spaces 606 and 608, the first resist 602 is removed.

Figure 6D:
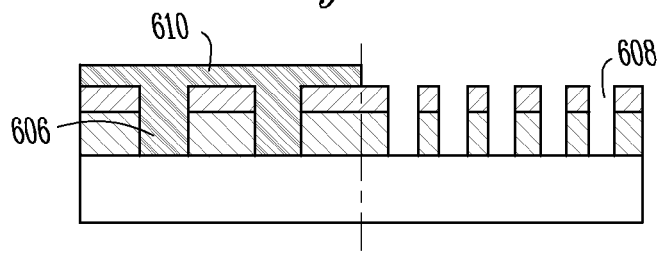
Figure 6E:
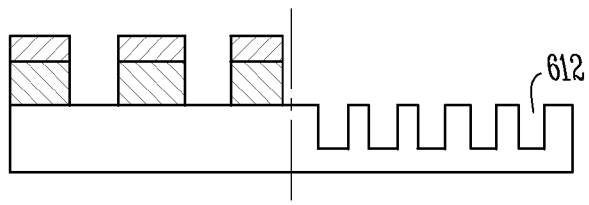

In FIG. 6D, a second resist 610 is formed only over the first region 600A, filling spaces 606, but leaving spaces 608 open to expose portions of the first reticle material 510. In FIG. 6E, the spaces 608 are used to pattern and form spaces 612 in the first reticle material 510 within the second region 600B of the reticle 600. In one example, the spaces 612 form sub-resolution phase shifting features in the first reticle material 510. After the spaces 612 are formed in the first reticle material 510, the portions of the second reticle material 512 and the third reticle material 514 not protected by the second resist 610 are removed. In one example, the second reticle material 512 and the third reticle material 514 are removed in a single processing operation by removing the second reticle material 512. In one example, the second reticle material 512 and the third reticle material 514 are removed using two material specific removal processes such as etching operations. After the spaces 612 are formed in the first reticle material 510, and the portions of the second reticle material 512 and the third reticle material 514 not protected by the second resist 610 are removed, the second resist 610 is removed.

Figure 6F:
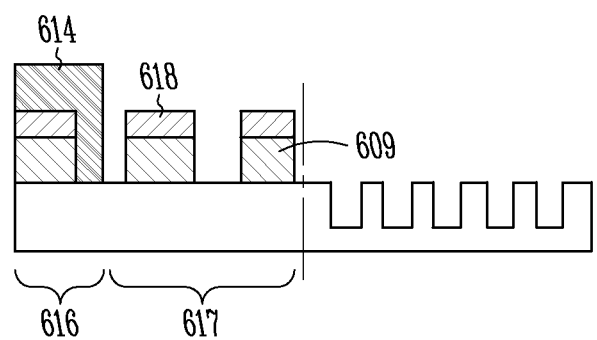
Figure 6G:
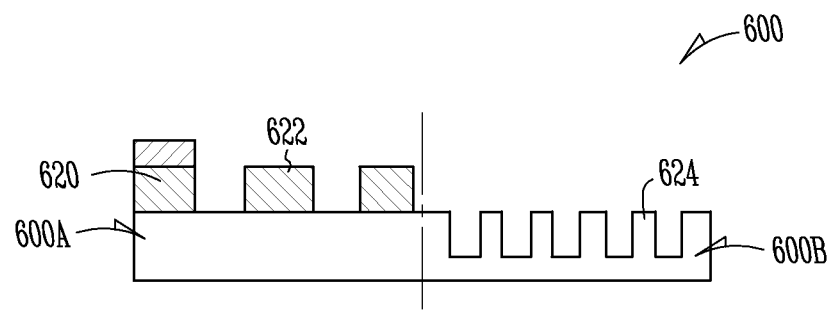

FIG. 6F shows a third resist 614 covering a portion of the first region 600A of the reticle 600. In FIG. 6F, the third resist 614 is used to protect region 616 within the first region 600A, leaving region 617 exposed to further processing. In FIG. 6G, a portion 618 of the third reticle material 514 is removed from within the region 617 left unprotected by the third resist 614. A portion 609 of the second reticle material 512 is left behind within the region 617 left unprotected by the third resist 614. In one example, the removal of the portion 618 while leaving the portion 609 is accomplished with a material selective etch.

The resulting reticle 600 includes an active region 600A with features 622 that are phase shifting features, and features 620 that are energy blocking features. The combination of phase shifting features 622 and energy blocking features 620 in the active region 600A provides multiple lithography tools to sharpen and otherwise enhance functionally important features printed on a working surface. At the same time, the resulting reticle 600 includes an inactive region 600B with features 624 formed from a single reticle material 510. In examples where the single reticle material 510 is substantially transparent, a high transmission of energy is passed through the inactive region 600B, while maintaining the ability of features 624 to diffract and direct energy to portions of a lens for a compensating effect.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon studying the above description.

What is claimed is:

1. A method of forming a patterning tool, comprising:
    forming an attenuating material over a substantially transparent material;
    forming an energy blocking material over the attenuating material;
    forming phase shifting features in the attenuating material in an active region of the patterning tool; and
    forming phase shifting features in the substantially transparent material in an inactive region of the patterning tool.

2. The method of claim 1, wherein forming phase shifting features in the attenuating material in an active region of the patterning tool comprises removing selected portions of the energy blocking material and the attenuating material.

3. The method of claim 1, wherein forming phase shifting features in the substantially transparent material comprises forming sub-resolution features in the substantially transparent material.

4. The method of claim 1, wherein forming an attenuating material comprises forming a layer of molybdenum silicide over the substantially transparent material.

5. The method of claim 1, wherein forming an energy blocking material comprises forming a layer of chrome over the attenuating material.

6. The method of claim 1, wherein forming an attenuating material over a substantially transparent material comprises forming the attenuating material over a silicon dioxide reticle substrate.

7. The method of claim 1, wherein forming an attenuating material over a substantially transparent material comprises forming the attenuating material over a quartz reticle substrate.

8. A patterning tool, comprising:
    an active region configured to form a first diffraction image on a lens when in use;
    an inactive region configured to form a second diffraction image on the lens when in use;
    wherein the inactive region includes a pattern of phase shifting features formed in a substantially transparent material of the patterning tool.

9. The patterning tool of claim 8, wherein the pattern of phase shifting features comprises a sub-resolution pattern.

10. The patterning tool of claim 8, wherein the inactive region is less than 27 percent of an area of the patterning tool.

11. The patterning tool of claim 8, wherein the inactive region is less than 11 percent of area of the patterning tool.

12. The patterning tool of claim 8, wherein the substantially transparent material comprises silicon dioxide.

13. The patterning tool of claim 8, wherein the substantially transparent material comprises quartz.

14. The patterning tool of claim 8, wherein the active region includes a pattern of phase shifting features formed in an attenuating material.

15. The patterning tool of claim 14, wherein the attenuating material comprises molybdenum silicide.

16. The patterning tool of claim 8, wherein the active region includes a pattern of features formed in an energy blocking material.

17. The patterning tool of claim 16, wherein the energy blocking material comprises chromium.

* * * * *